US012770689B2

(12) United States Patent
Talapaneni

(10) Patent No.: US 12,770,689 B2
(45) Date of Patent: Oct. 20, 2026

(54) DYNAMIC WORDLINE START VOLTAGE COMPUTATION

(71) Applicant: Micron Technology, Inc., Boise, ID (US)

(72) Inventor: Sai Kishore Talapaneni, Anantapur (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/988,629

(22) Filed: Dec. 19, 2024

(65) Prior Publication Data

US 2026/0179688 A1 Jun. 25, 2026

(51) Int. Cl.
*G11C 16/10* (2006.01)
*G06F 12/02* (2006.01)
*G11C 16/04* (2006.01)
*G11C 16/08* (2006.01)
*G11C 16/34* (2006.01)

(52) U.S. Cl.
CPC .......... *G11C 16/10* (2013.01); *G06F 12/0246* (2013.01); *G11C 16/0483* (2013.01); *G11C 16/08* (2013.01); *G11C 16/349* (2013.01)

(58) Field of Classification Search
CPC ..... G11C 16/10; G11C 16/0483; G11C 16/08; G11C 16/349; G06F 12/0246
See application file for complete search history.

(56) References Cited

U.S. PATENT DOCUMENTS 10,665,301 B1 * 5/2020 Lu .......................... G11C 16/08
2008/0175069 A1 * 7/2008 Wang ................ G11C 16/3404 365/185.11
2020/0090760 A1 * 3/2020 Purahmad .......... G11C 16/3495
2020/0185040 A1 * 6/2020 Bhatia .................... G11C 16/26
2022/0036944 A1 * 2/2022 Han ....................... G11C 16/32
2023/0343395 A1 * 10/2023 Zhang ................. G11C 11/5628
2023/0393991 A1 * 12/2023 Chang ................. G06F 12/0692
2024/0168642 A1 * 5/2024 Wan .................. G11C 16/0483

* cited by examiner

*Primary Examiner* — Nanci N Wong
(74) *Attorney, Agent, or Firm* — Schwegman Lundberg & Woessner, P.A.

(57) ABSTRACT

A system and method for programming memory devices includes receiving a request to program data to an individual word line (WL) of a memory device. A set of attributes associated with the individual WL is determined and used to compute a program voltage offset. The program voltage offset is calculated based on characteristics like WL zone groupings and program/erase cycle counts of the memory device. Data is then programmed to the individual WL using a program pulse that is generated based on combining a base program voltage with the computed program voltage offset.

20 Claims, 6 Drawing Sheets

306

318 310 312

308

320 316 322

314

| | | |
|---|---|---|
| WL ZONE 1 | FIRST PEC RANGE | PROGRAM VOLTAGE OFFSET 1 |
| WL ZONE 1 | SECOND PEC RANGE | PROGRAM VOLTAGE OFFSET 2 |
| WL ZONE 3 | FIRST PEC RANGE | PROGRAM VOLTAGE OFFSET 3 |
| WL ZONE 4 | FIRST PEC RANGE | PROGRAM VOLTAGE OFFSET 4 |
| WL ZONE 4 | SECOND PEC RANGE | PROGRAM VOLTAGE OFFSET 5 |

FIG. 3

DYNAMIC WORDLINE START VOLTAGE COMPUTATION

TECHNICAL FIELD

Examples of the disclosure relate generally to memory sub-systems and, more specifically, to optimizing programming voltages in NAND memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various examples of the disclosure. The drawings, however, should not be taken to limit the disclosure to the specific examples, but are for explanation and understanding only.

FIG. 3 is an example look-up table, in accordance with some examples.

DETAILED DESCRIPTION

Figure 1:
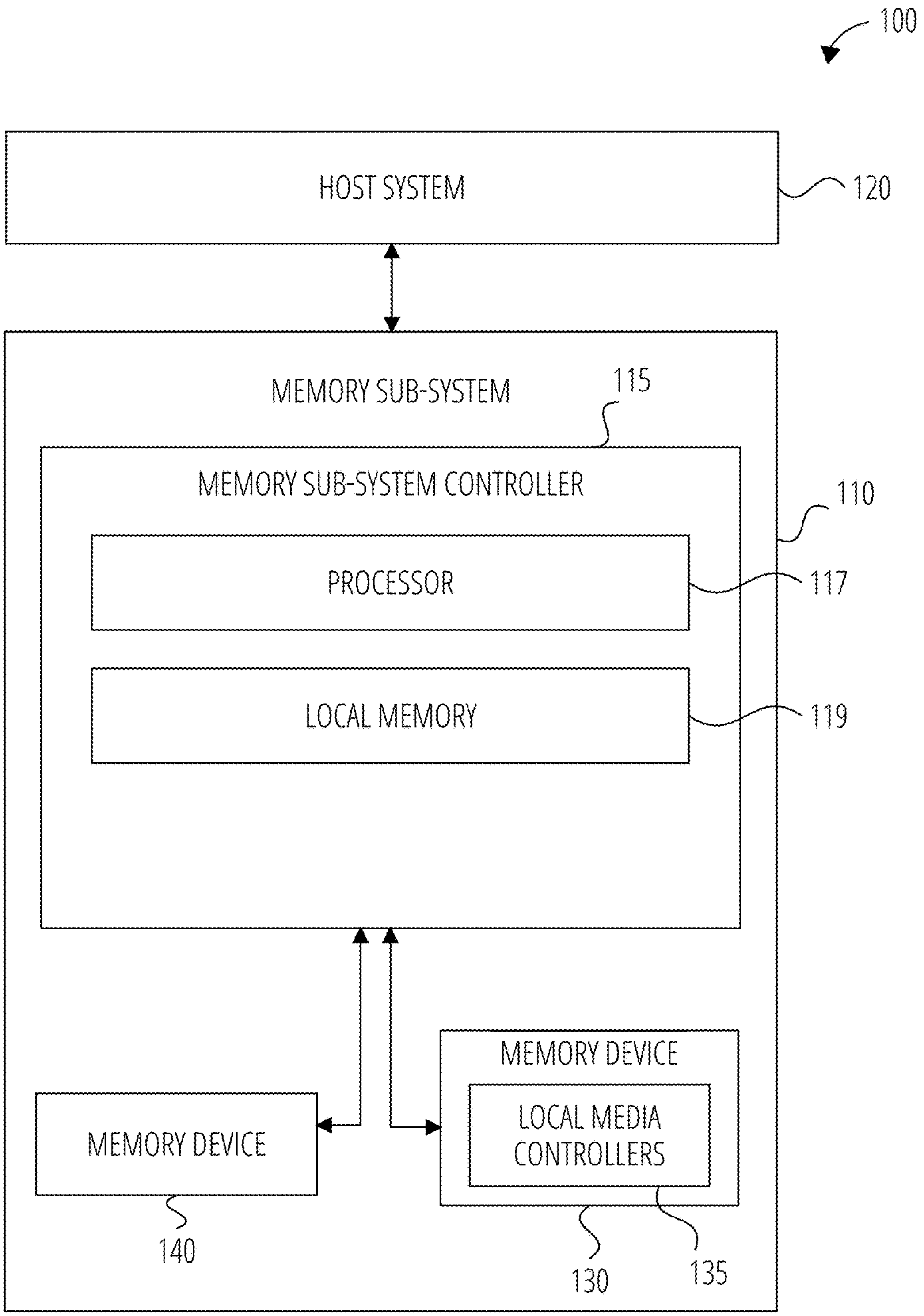
FIG. 1 is a block diagram illustrating an example computing system that includes a memory sub-system, in accordance with some examples.

The present disclosure is directed to a system including a memory device and a processing device, operatively coupled to the memory device, configured to perform operations that improve programming time (tPROG) in NAND memory devices, such as flash memory devices. Specifically, the disclosed processing device (e.g., a local media controller) determines attributes associated with word lines (WLs) and computes optimized programming voltage offsets to reduce unnecessary programming pulses. The processing device receives a request to program data to a WL and calculates a program voltage offset based on characteristics, such as WL zone groupings and/or program/erase cycle counts (PECs). Rather than starting programming from a fixed base voltage and incrementally increasing it until cells begin programming, the processing device utilizes pre-characterized information (e.g., a mathematical function and/or a look-up table) to start programming at an optimized higher voltage level. This approach avoids wasting time with unnecessary initial program pulses while ensuring safe programming voltages are used. The optimization is performed by the local media controller using mathematical functions derived during device characterization and manufacturing, which enhances the overall operations of the memory system by improving programming efficiency and performance.

A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command, erase command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data" or "user data."

A host request can include logical address information (e.g., logical block address (LBA), namespace) for the host data, which is the location the host system associates with the host data and a particular zone in which to store or access the host data. The logical address information (e.g., LBA, namespace) can be part of metadata for the host data. Metadata can also include error handling data (e.g., error-correcting code (ECC) code word, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection (GC) management operations. The data that is re-written, for example as initiated by the firmware, is hereinafter referred to as "GC data."

Examples of system data include, but are not limited to, system tables (e.g., logical-to-physical memory address mapping table, also referred to herein as a logical-to-physical (L2P) mapping table (referred to as an L2P table), data from logging, scratch pad data, and so forth).

A memory device can be a non-volatile memory device. A non-volatile memory device is a package of one or more die. Each die can be comprised of one or more planes. For some types of non-volatile memory devices (e.g., AND-type devices), each plane is comprised of a set of physical blocks. For some memory devices, blocks are the smallest area that can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package. The memory device can be divided into one or more zones where each zone is associated with a different set of host data or user data or application.

Certain memory devices, such as NAND-type memory devices, include one or more blocks (e.g., multiple blocks), with each of those blocks including multiple memory cells. For instance, a memory device can include multiple pages, stored across one or more WLs, with each page including a subset of memory cells of the memory device. A threshold voltage (VT) of a memory cell (of a block) can be the voltage at which the floating gate (e.g., NAND transistor), implementing the memory cell, turns on and conducts (e.g., to a bit line coupled to the memory cell). Generally, writing data to such memory devices involves programming (by way of a program operation) the memory devices at the page level of a block, and erasing data from such memory devices involves erasing the memory devices at the block level (e.g., page level erasure of data is not possible).

In conventional NAND memory systems, programming operations start from a predefined static base programming voltage (Vpgm). The local media controller receives a request to program data to a WL and initially attempt to program the data starting from the Vpgm. The local media controller incrementally increases the voltage in small steps until the memory cells begin to program. This process is known as the sampling phase which is used to sample the voltage offset for programming subsequent sub-blocks in the same WL. For example, programming typically begins at a conservative base voltage like 12V and increases in steps of 0.3V (e.g., 12.0V, 12.3V, 12.6V, etc.) until reaching the actual required programming voltage, which may be significantly higher, such as 14.2V or 14.5V. Once the voltage offset is sampled and determined for the first sub-block, the remaining sub-blocks in the same WL can be programmed faster using the sampled voltage offset. This approach is particularly inefficient because during the device's early life, no actual cell programming occurs until reaching these higher voltage levels. The system wastes time applying multiple unnecessary programming pulses at lower voltages that do not result in any charge being stored in the memory cells.

The inefficiency is compounded by the NAND architecture's sub-block structure. In current implementations, each block contains multiple sub-blocks (typically four), and programming starts from the base voltage for the first sub-block (sub-block 0) of every WL. While the system can use a sampled offset voltage for programming the remaining sub-blocks, the system still wastes time with unnecessary pulses when programming 25% of the pages (those in sub-block 0). This effect is pronounced during the memory device's start-of-life period because younger devices may need more aggressive programming voltages for electron tunneling through the oxide layer. As a result, the number of unnecessary initial program pulses can be higher during the device's early life, which contributes to increased programming latency (tPROG) across the NAND device.

The present disclosure addresses these inefficiencies by implementing a more proactive and optimized programming approach. Upon receiving a request to program data to a WL, the disclosed techniques calculate an optimized programming voltage offset based on various attributes of the WL, such as WL zone characteristics and PEC of the WL. Rather than starting from a conservative base voltage and wasting time with unnecessary program pulses, the disclosed techniques utilize pre-characterized information, such as mathematical functions, to determine an appropriate higher starting voltage. This approach can reduce or eliminate the delay associated with incrementally increasing voltages until cells begin programming. By starting at an optimized voltage level that skips unnecessary initial pulses while maintaining safe programming margins, the disclosed techniques reduce programming latency at any given time, improving overall system performance. The dynamic voltage optimization allows for a more efficient programming methodology, particularly during device start-of-life when conventional systems waste the most time with unnecessary pulses. This results in reduced programming latency (tPROG) and improved efficiency compared to conventional methods.

In some examples, the techniques described herein relate to a system having a processing device, operatively coupled to a memory device. The memory device and processing device work together to optimize programming operations. When the system receives a request to program data to a WL, the processing device first determines attributes of that WL and uses those attributes to compute an optimized program voltage offset. The processing device then programs the data using a pulse that combines a base program voltage with this computed offset.

The processing device can determine WL attributes in multiple ways. In some cases, the processing device identifies which WL zone the target WL belongs to, where zones group together WLs that exhibit similar programming voltage characteristics. The processing device can also obtain the PEC of the block containing the target WL. To compute the program voltage offset, the processing device can either apply a mathematical function or use a look-up table. The mathematical function can take the PEC and WL zone identifier as inputs to generate the offset. Alternatively, the processing device can retrieve the offset from a look-up table that maps different combinations of PEC ranges and WL zones to specific voltage offsets.

In some examples, the programming process begins with the first sub-block, using a pulse that starts at the base voltage plus the computed offset. After programming this initial sub-block, the processing device receives a sampled voltage offset from the memory device. This sampled offset is then used for programming the remaining sub-blocks. During programming, the processing device monitors cell states to detect when they transition from erased to programmed states, storing the sampled offset in a device register.

To optimize efficiency across multiple programming operations, the processing device can implement a zone-based caching mechanism. The processing device can store the computed offset and set a flag for the current WL zone. When programming additional WLs in the same zone, the processing device can retrieve and reuse this cached offset rather than computing it again. When moving to a different zone, the processing device can clear the previous zone's flag and computes a new offset.

The mathematical function used for computing the offset can be derived during device characterization and manufacture through testing. This can involve collecting programming voltage offset values across multiple sample devices at different PEC values, from new devices through end-of-life. The collected data is analyzed to identify WLs with similar characteristics for zone grouping. The function's coefficients can be derived to ensure the computed offsets remain below actual required programming voltages while still enabling the system to skip unnecessary initial program pulses.

The processing device can be implemented as a local media controller that receives instructions from a memory controller in the memory sub-system. The memory device itself can be implemented as a 3D NAND device.

Though various examples are described herein as being implemented with respect to a memory sub-system (e.g., a controller of the memory sub-system), some or all of the portions of an example can be implemented with respect to a host system, such as a software application or an operating system of the host system.

FIG. 1 illustrates an example computing system 100 that includes a memory sub-system 110, in accordance with some examples. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some examples, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a compute express link (CXL) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory devices 130, 140 when the memory sub-system 110 is coupled with the host system 120 by the PCIe or CXL interface. The physical host interface can provide an interface for passing control, address, data, and other signals between the memory sub-system 110 and the host system 120.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a NAND-type flash memory and write-in-place memory, such as a 3D cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional (2D) NAND and 3D NAND.

Each of the memory devices 130, 140 can include one or more arrays of memory cells. One type of memory cell, for example, single level cells (SLCs), can store one bit per cell. Other types of memory cells, such as multi-level cells (MLCs), tri-level cells (TLCs), quad-level cells (QLCs), and penta-level cells (PLCs), can store multiple bits per cell. In some examples, each of the memory devices 130, 140 can include one or more arrays of memory cells such as SLCs, MLCs, TLCs, QLCs, or any combination of such. In some examples, a particular memory device can include an SLC portion, and an MLC portion, a TLC portion, or a QLC portion of memory cells. The memory cells of the memory devices 130, 140 can be grouped as pages that can refer to a logical unit of the memory device used to store data. With some types of memory (e.g., NAND), pages can be grouped to form blocks or BSs. As used herein, a block comprising SLCs can be referred to as a SLC block, a block including MLCs can be referred to as an MLC block, a block comprising TLCs can be referred to as a TLC block, and a block comprising QLCs can be referred to as a QLC block.

Although non-volatile memory components such as NAND-type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide-based RRAM (OxRAM), negative- or (NOR) flash memory, and electrically erasable programmable read-only memory (EEPROM).

A memory sub-system controller 115 (or controller 115 for simplicity) can communicate with the memory devices 130, 140 to perform operations such as reading data, writing data, or erasing data (e.g., performing GC operations) at the memory devices 130, 140 and other such operations. The memory sub-system controller 115 can include hardware such as one or more integrated circuits and/or discrete components, a buffer memory, or a combination thereof. The hardware can include digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some examples, the local memory 119 can include memory registers storing memory pointers, fetched data, and so forth. The local memory 119 can also include ROM for storing micro-code. While the example memory sub-system 110 in FIG. 1 has been illustrated as including the memory sub-system controller 115, in another example, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, GC operations, error detection and ECC operations, encryption operations, caching operations, and address translations between a logical address (e.g., LBA, namespace) and a physical memory address (e.g., physical block address in a physical address space of the memory device 130 or memory device 140) that are associated with the memory devices 130, 140. The memory sub-system controller 115 can further include host interface circuitry to communicate with the host system 120 via the physical host interface. The host interface circuitry can convert the commands received from the host system 120 into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some examples, the memory sub-system 110 can include a cache or buffer (e.g., DRAM) and address circuitry (e.g., a row decoder and a column decoder) that can receive an address from the memory sub-system controller 115 and decode the address to access the memory devices 130, 140.

In some examples, the memory device 130 includes local media controllers 135 that operate in conjunction with memory sub-system controller 115 to execute operations on one or more memory cells of the memory device 130. An external controller (e.g., memory sub-system controller 115) can externally manage the memory device 130 (e.g., perform media management operations on the memory device 130). In some examples, a memory device 130 is a managed memory device, which is a raw memory device combined with a local controller (e.g., local media controller 135) for media management within the same memory device package. An example of a managed memory device is a managed NAND (MNAND) device. Any operation discussed as being performed by the memory sub-system controller 115 can be similarly performed by the local media controllers 135 and vice versa.

The memory sub-system controller 115 and/or the local media controllers 135 can include a program voltage component 208 (discussed in more detail below in connection with FIG. 2). The program voltage component 208 can receive a request to program data to an individual WL of the memory device 130. The program voltage component 208 can determine a set of attributes associated with the individual WL (e.g., a PEC associated with the WL and/or a zone or group associated with the WL). The program voltage component 208 can compute a program voltage offset based on the set of attributes associated with the individual WL and can program the data to the individual WL using a program pulse generated based on a base program voltage and the computed program voltage offset.

Specifically, the program voltage component 208 can calculate an optimized programming voltage offset based on various attributes of the WL, such as WL zone characteristics and PEC of the WL. Rather than starting from a conservative base voltage and wasting time with unnecessary program pulses, the program voltage component 208 can utilize pre-characterized information, such as mathematical functions, to determine an appropriate higher starting voltage. This approach can reduce or eliminate the delay associated with incrementally increasing voltages until cells begin programming. By starting at an optimized voltage level that skips unnecessary initial pulses while maintaining safe programming margins, the program voltage component 208 can reduce programming latency at any given time, improving overall system performance. The dynamic voltage optimization allows for a more efficient programming methodology, particularly during device start-of-life when conventional systems waste the most time with unnecessary pulses. This results in reduced programming latency (tPROG) and improved efficiency compared to conventional methods.

Any discussion with respect to the memory device 130 can similarly be applied to the memory device 140. Any function pertaining to the local media controllers 135 can, in some cases, be performed by the device) memory sub-system controller 115.

Figure 2:
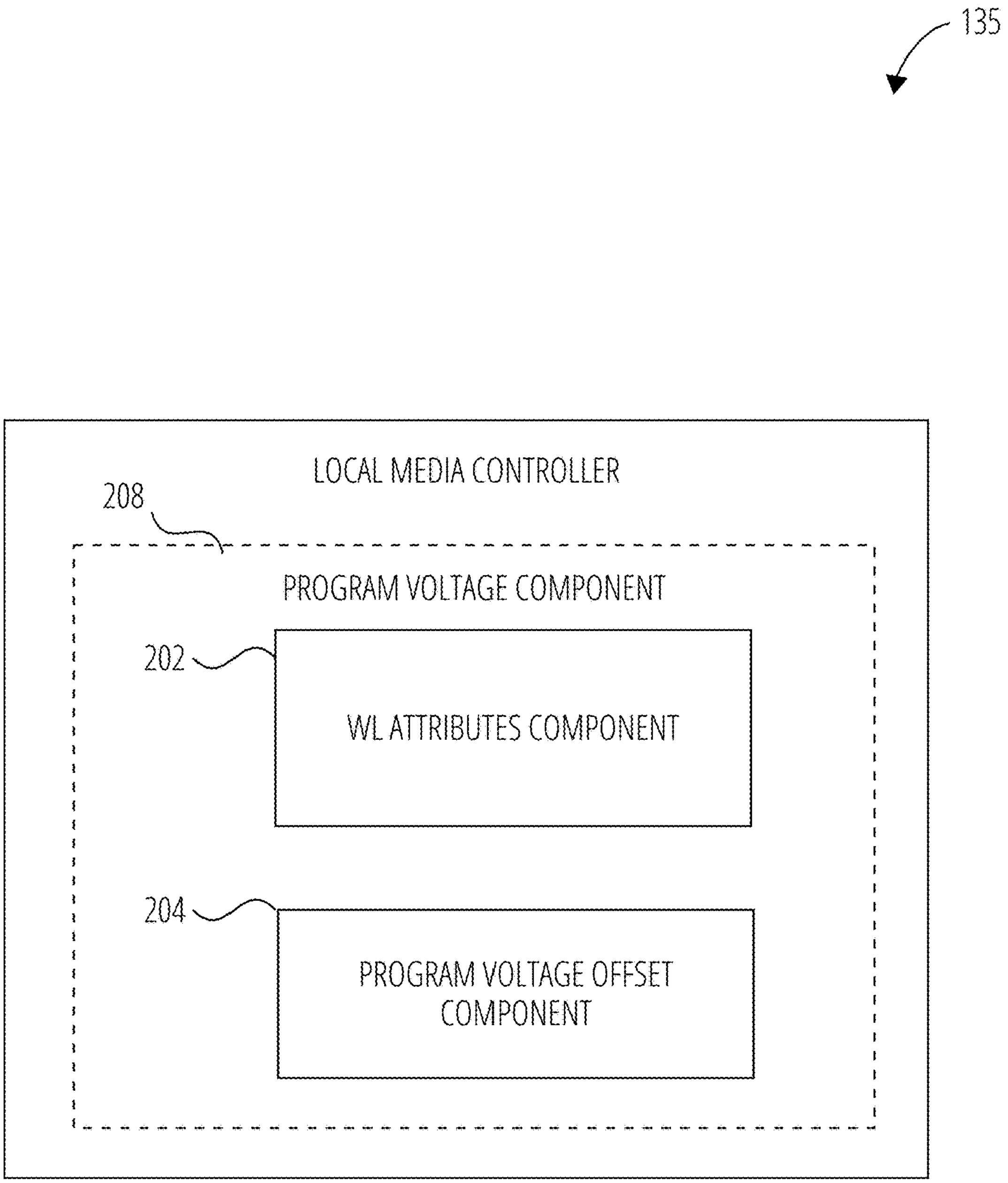
FIG. 2 is a block diagram of a local media controller implementing a program voltage component, in accordance with some examples.

FIG. 2 is a block diagram of a program voltage component 208, in accordance with some examples. The program voltage component 208 can include a WL attributes component 202 and/or a program voltage offset component 204. Specifically, the program voltage component 208 includes several subcomponents (e.g., the WL attributes component 202 and the program voltage offset component 204) that work together to improve the operations of the memory sub-system 110. The program voltage component 208 can be implemented as part of the local media controllers 135.

Specifically, the program voltage component 208 can receive a programming request (e.g., from the memory sub-system controller 115 and/or the host system 120) to program a set of data to a target WL. In such cases, the WL attributes component 202 determines key characteristics of the target WL. The WL attributes component 202 can do by identifying which WL zone the target WL belongs to. WL zones can include groups of WLs that exhibit similar programming voltage behavior. The WL attributes component 202 may also obtain the PEC of the block containing the target WL.

The program voltage offset component 204 uses these attributes to compute an optimized programming voltage offset at which to initiate programing of the data to a first sub-block (e.g., SB0) of the target WL. In some cases, the program voltage offset component 204 applies a mathematical function that takes the PEC and zone identifier as inputs and generates the programming voltage offset. The coefficients of the mathematical function can be carefully derived during device characterization (e.g., during device manufacture and testing) to ensure safe but efficient programming. In some cases, the program voltage offset component 204 can retrieve the programming voltage offset from a look-up table. The look-up table, such as the look-up table 306 (of FIG. 3) may store multiple zones, each associated with different PEC ranges and corresponding program voltage offsets. For example, a first zone may have different offsets for early-life versus later-life PEC ranges.

During programming operations, the components of the program voltage component 208 work together to program the first sub-block using a pulse that combines the base voltage with the computed program voltage offset. For instance, if the base voltage is 12V and the computed offset is 2.2V, programming may start at 14.2V rather than incrementing up from 12V. After programming the first sub-block, the program voltage component 208 (e.g., the program voltage offset component 204) can receive a sampled voltage offset from the memory device 130. The program voltage offset component 204 then uses this sampled offset together with the base program voltage (e.g., Vpgm+Vo and/or Vpgm+Vo+Vf, where Vpgm is the base program voltage, Vo is a sampled offset, and Vf is the voltage offset generated by the look-up table and/or mathematical function and used to initially read the first sub-block of the target WL) to program the remaining sub-blocks (e.g., sub-blocks SB1, SB2, and SB3).

To improve efficiency across multiple operations, the program voltage component 208 implements a zone-based caching mechanism. The computed offset can be stored and associated with a zone flag. When programming additional WLs in the same zone, the cached offset may be reused rather than computing a new one. The program voltage component 208 can handle zone transitions by clearing previous zone flags when moving to different zones. For example, when programming moves from WLs in zone 1 to zone 2, the program voltage offset component 204 can clear zone 1's flag and compute a new offset for zone 2, thereby setting the flag for zone 2.

The mathematical functions used by the program voltage component 208 can be developed through extensive testing during device characterization. This can involve collecting programming voltage data across multiple sample devices at different PEC values, from new devices through end-of-life. The collected data helps identify WLs with similar characteristics for zone grouping. For instance, WLs 1-6 may form one zone while WLs 7-25 form another based on their programming behavior. The program voltage component 208 analyzes this data to derive function coefficients that ensure computed offsets remain below actual required programming voltages while still enabling unnecessary pulse skipping. This helps avoid over-programming while maximizing efficiency.

For example, normal program operations can be performed on a large number of NAND samples of a particular NAND series with their average PECs ranging from zero to the end-of-life value. Across these PECs values, as the program operations happen with traditional algorithms, the NAND generated program voltage offset value is stored for each WL from the SB0 sampling. In this way, the relation between NAND generated program voltage offset and PEC value of the virtual block can be obtained for every WL. Then, a PEC vs. program voltage offset graph can be plotted. After eliminating the extreme outliers in this data, a mathematical function that most closely represents the relation between the PEC and program voltage offset can be obtained using data analysis tools (such as MATLAB). This is for a single WL. Since there exists data for every WL, the WL number (e.g., WLn) can be a variable of this function.

WLs that intrinsically behave same, can be grouped into different zones, and WL zone number ($WLZ_n$) can be variable of the function (instead of $WL_n$), which can reduce the complexity of the function. This is so by compromising on the precision of the program voltage offset of individual WLs. So, a program voltage offset predicted or computed by the function for a specific WL zone can be applicable for all the WLs in that zone. The mathematical function can be represented as: Zonal smart offset=$V_f$=f(PEC, $WLZ_n$), where Vf is the program voltage offset that is used for adjusting a base program voltage (Vpgm) of a given WL. For any PEC and WL, the program voltage offset predicted by the function 'f' may be less than the actual NAND generated program voltage offset, but significant enough that it enables the program voltage component 208 to skip the initial program pulses. In some cases, WLs with their PEC vs. program voltage offset plots closer together may be grouped into a common zone.

For new devices, the program voltage component 208 may compute more aggressive offsets since younger devices often need higher voltages for electron tunneling. As devices age, the computed offsets can adjust based on the changing PEC values. The program voltage component 208 can track programming success by monitoring cell state transitions. When cells begin moving from erased to programmed states, the actual programming voltage can be recorded in a device register for future reference.

In some implementations, the program voltage component 208 maintain separate offset tracking for different zones. This allows customized voltage optimization based on the unique characteristics of each zone's WLs. The components can implement adaptive programming by adjusting offsets based on programming results. If cells program successfully, the offset may be maintained or slightly increased. If programming issues occur, the offset can be reduced.

For multi-block operations, the components may track PEC values at the block level. This allows precise offset computation based on each block's specific program/erase history. The zone-based approach can reduce computation overhead by grouping similar WLs. Rather than calculating unique program voltage offsets for each WL, the program voltage component 208 can apply zone-level optimizations.

When programming patterns change, the program voltage component 208 can adapt by updating zone assignments or modifying offset calculations. This flexibility helps maintain optimal performance as device characteristics evolve. Throughout all operations, the program voltage component 208 maintains data integrity by ensuring computed offsets remain within safe operating margins. This balanced approach helps achieve faster programming while avoiding potential reliability issues.

In some cases, the programming process follows a systematic flow when handling WL operations. When programming begins, the program voltage component 208 can first obtain the WL number and determines which WL zone that WL belongs to. The program voltage component 208 then checks if a zonal offset flag is already set for that zone. If the flag is not set, indicating no cached offset exists, the program voltage component 208 retrieves the PEC value for the block being programmed. These values are then input into the mathematical function (and/or look-up table 306) to compute the WL start voltage (WLSV) zonal smart offset. After computing the offset, the program voltage component 208 sets a flag for the current zone while clearing any flag that was set for the previous zone.

If the zonal offset flag is already set when checked, the program voltage component 208 can continue without recalculating the offset, as a valid offset is already cached for that zone. This cached offset remains valid until programming moves to a WL in a different zone. The actual programming begins with pulses starting at a voltage level equal to the base program voltage (Vpgm) plus the computed or cached zonal offset. This optimized starting voltage is used consistently for programming operations within the same WL zone.

For non-SB0 (non-first sub-block) programming operations, the program voltage component 208 reverts to the program voltage offset algorithm that uses precomputed and sampled voltage offsets of the SB0 block optionally in combination with the mathematically computed offset.

FIG. 3 is an example look-up table 306, in accordance with some examples.

Specifically, the look-up table 306 can be used by the program voltage component 208 to determine appropriate program voltage offsets. The program voltage component 208 can contain multiple entries mapping WL zones and PEC ranges to specific voltage offsets.

In some examples, a first entry 308 in the look-up table 306 can associate WL Zone 1 (WL zone 318) and a first PEC range 310 with a first program voltage offset 312. This allows the program voltage component 208 to retrieve optimized offset values for WLs in Zone 1 during their early lifecycle stage. The second entry 314 shows how the same WL Zone 1 (WL zone 320) can be paired with second PEC range 316 that uses a different second program voltage offset 322. This structure enables the program voltage component 208 to adjust voltage offsets as blocks age and experience more PEC.

The zone-based organization in the look-up table 306 reflects how WLs with similar programming characteristics are grouped together. Rather than storing individual offsets for each WL, the look-up table 306 efficiently manages offsets at the zone level while accounting for different lifecycle stages through PEC ranges. The look-up table 306 structure supports dynamic voltage optimization by providing quick access to pre-characterized offset values. When programming a WL, the program voltage component 208 can quickly look up an appropriate offset based on both the WL's zone membership and current PEC count.

The offset values stored in entries (e.g., first entry 308 and second entry 314) can be carefully determined during device characterization to ensure they remain below actual required programming voltages while still enabling the system to skip unnecessary initial program pulses. Multiple entries per zone, each with different PEC ranges (first PEC range 310 and second PEC range 316), allow the program voltage component 208 to adapt its programming approach as devices age. This is particularly important since younger devices often require more aggressive programming voltages for electron tunneling.

The look-up table 306 can provide an alternative to using mathematical functions for offset computation. While both approaches can achieve similar results, the table structure offers potentially faster offset determination through direct lookup operations using the WL attributes component 202 and program voltage offset component 204. The look-up table 306 organization also supports efficient updates if needed, as entries (308, 314) can be modified based on ongoing characterization data while maintaining the fundamental relationships between zones (318, 320) and PEC ranges (310, 316).

In some examples, the program voltage component 208 can implement a zone-based flag system to optimize offset management across multiple programming operations. When computing a program voltage offset for a WL zone using the look-up table 306 (or using the mathematical function, discussed previously), the program voltage component 208 can set a zone offset flag associated with that zone. For example, after retrieving a program voltage offset from an entry (e.g., first entry 308) for WL Zone 1 (e.g., WL zone 318), the program voltage component 208 can set a flag indicating it has a valid offset cached for that zone. Flags for other zones can remain cleared to cause updates to the corresponding program voltage offsets if a WL is programmed that is in those zones. Only one flag can be set at a given time. Namely, flags associated with all other WL zones remain cleared while one zone has its corresponding flag set.

In some cases, the setting of the flag allows subsequent programming operations targeting WLs in the same zone to reuse the cached program offset value (e.g., that was mathematically computed or determined via searching the look-up table 306) rather than performing another table lookup or mathematical computation. When programming moves to WLs in a different zone, the program voltage component 208 clears the flag associated with the previous WL zone before setting a new flag for the current zone. For instance, when transitioning from WL Zone 1 (WL zone 318) to a different zone, the Zone 1 flag can be cleared, and a new flag would be set after computing the appropriate offset for the new zone.

This flag-based caching mechanism helps reduce computational overhead by allowing offset reuse within zones while ensuring proper offset transitions between zones. The flags work in conjunction with the look-up table 306 to maintain accurate tracking of which zones have valid cached offsets at any given time. The program voltage component 208 maintains these zone flags throughout the programming sequence, clearing and setting them as needed based on the WL zones being programmed. This dynamic flag management ensures that the correct program voltage offsets are used while minimizing unnecessary lookups to the look-up table 306.

Figure 4:
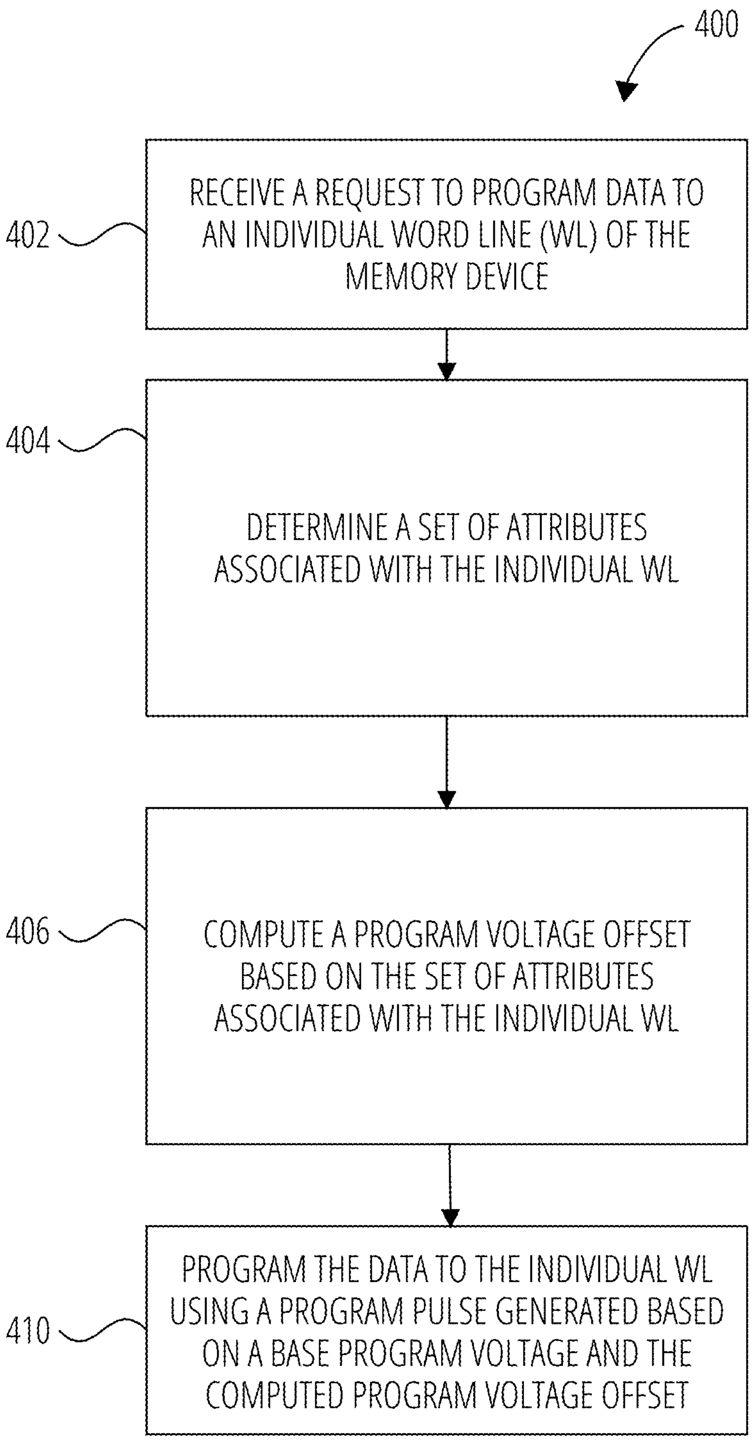
FIG. 4 illustrates a diagram of operations performed using the program voltage component, in accordance with some examples.

FIG. 4 illustrates a diagram 400 of operations performed using the program voltage component 208, in accordance with some examples. The method or process of diagram 400 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method or process of diagram 400 is performed by the memory sub-system controller 115, local media controllers 135, and/or subcomponents of the memory sub-system controller 115 and/or local media controllers 135 of FIG. 1. In these examples, the method or process of diagram 400 can be performed, at least in part, by the program voltage component 208. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 4, the method begins at operation 402 with the program voltage component 208 receiving a request to program data to an individual WL of the memory device. At operation 404, the program voltage component 208 determines a set of attributes associated with the individual WL, such as its WL zone and PEC. At operation 406, the program voltage component 208 computes a program voltage offset based on the determined attributes of the individual WL using either a mathematical function or look-up table. Finally, at operation 410, the program voltage component 208 programs the data to the individual WL using a program pulse that combines the base program voltage with the computed program voltage offset.

Figure 5:
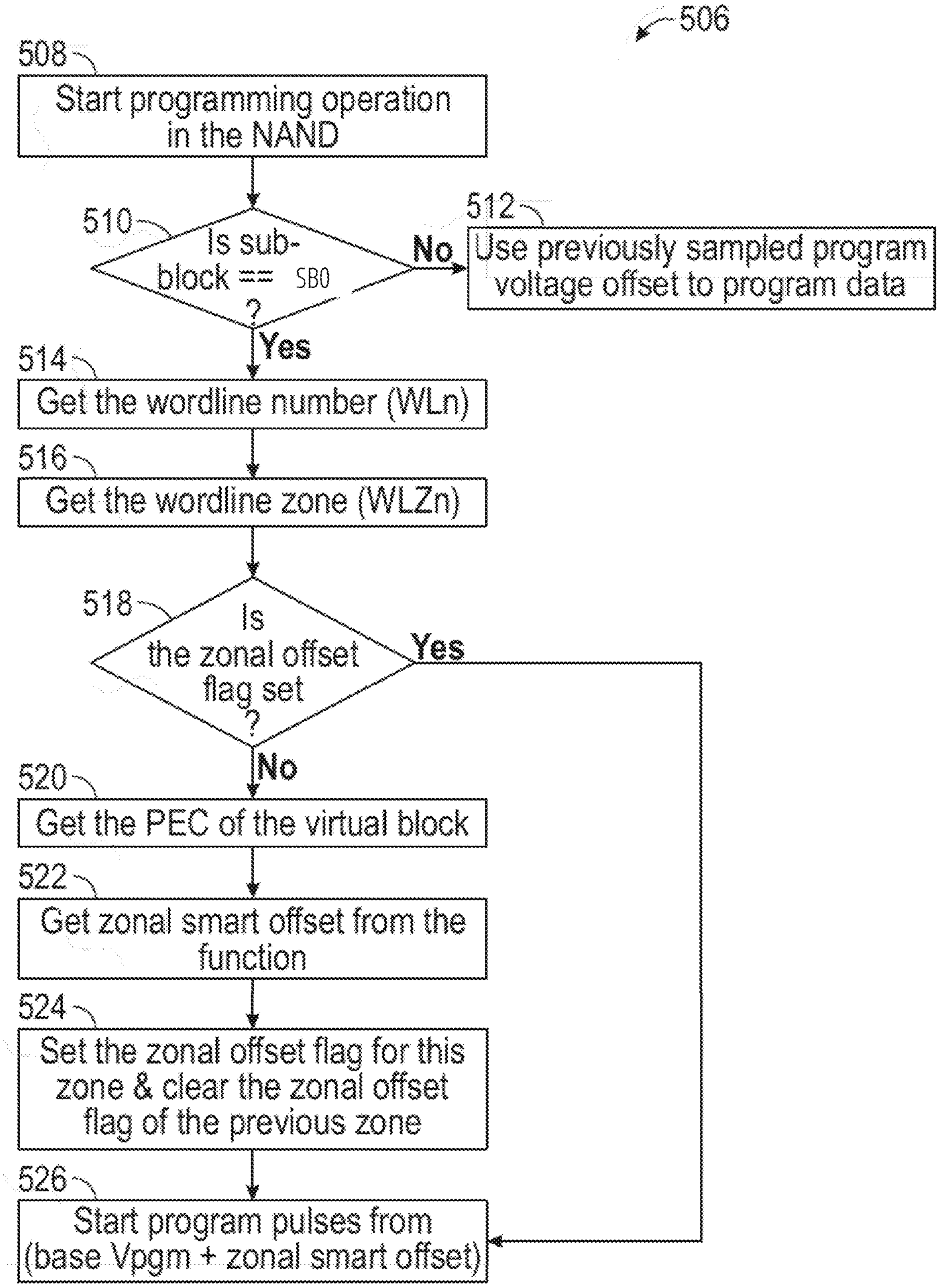
FIG. 5 illustrates a diagram of operations performed using the program voltage component, in accordance with some examples.

FIG. 5 illustrates a diagram 506 of operations performed using the program voltage component 208, in accordance with some examples. The method or process of diagram 506 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some examples, the method or process of diagram 506 is performed by the memory sub-system controller 115, local media controllers 135, and/or subcomponents of the memory sub-system controller 115 and/or local media controllers 135 of FIG. 1. In these examples, the method or process of diagram 506 can be performed, at least in part, by the program voltage component 208. Although the processes are shown in a particular sequence or order, unless otherwise specified, the order of the processes can be modified. Thus, the illustrated examples should be understood only as examples; the illustrated processes can be performed in a different order, and some processes can be performed in parallel. Additionally, one or more processes can be omitted in various examples. Thus, not all processes are required in every example. Other process flows are possible.

Referring now to FIG. 5, the method begins at operation 508 with the program voltage component 208 initiating a programming operation in the NAND device, such as memory device 130. This can take place in response to the local media controller 135 of memory device 130 receiving a request to program data to a target WL from the memory sub-system controller 115. At operation 510, the program voltage component 208 determines if the current operation is for sub-block zero (SB0) (e.g., the first sub-block of the target WL). If the operation is not for SB0, at operation 512, the program voltage component 208 uses a previously sampled program voltage offset to program the data. For example, the program voltage component 208 can compute a program voltage as the base program voltage (Vpgm)+sampled voltage of the SB0 block+the mathematically computed program voltage offset. However, if the operation 510 determines that the operation is for the SB0, the method continues to operation 514 where the program voltage component 208 obtains the WL number (WLn) of the target WL.

At operation 516, the program voltage component 208 determines the WL zone (WLZn) for that WL number as one of the attributes of the target WL. Then, at operation 518, the program voltage component 208 checks if a zonal offset flag is already set for this zone. If the flag is not set, the program voltage component 208 performs operation 520 to retrieve the PEC value of the virtual block in the target WL as one of the attributes of the target WL. At operation 522, the program voltage component 208 computes the zonal smart offset using the mathematical function and/or the look-up table. The program voltage component 208 then at operation 524 sets the zonal offset flag for the current zone while clearing any flag from the previous zone. Finally, at operation 526, the program voltage component 208 initiates the program pulses starting from the base program voltage (Vpgm) plus the computed zonal smart offset. If the zonal offset flag was found to be set at operation 518, the method proceeds directly to operation 526, allowing reuse of the cached offset value.

Figure 6:
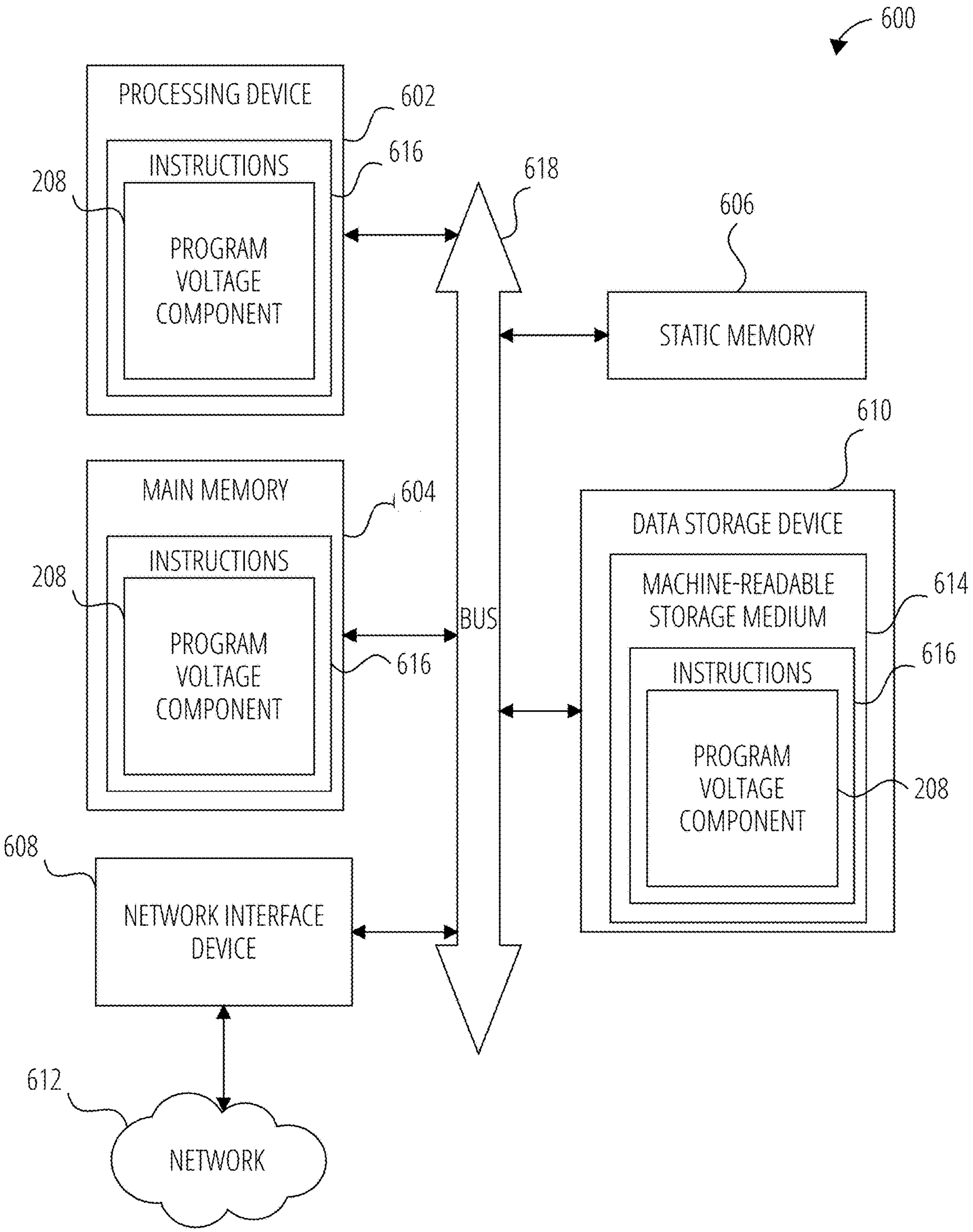
FIG. 6 is a block diagram of an example computer system, in accordance with some examples.

FIG. 6 illustrates an example machine in the form of a computer system 600 within which a set of instructions can be executed for causing the machine to perform any one or more of the methodologies discussed herein. In some examples, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative examples, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or Rambus DRAM (RDRAM), etc.), a static memory 606 (e.g., flash memory, static random access memory (SRAM), etc.), and a data storage device 610, which communicate with each other via a bus 618.

The processing device 602 represents one or more general-purpose processing devices such as a microprocessor, a central processing unit, or the like. More particularly, the processing device 602 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 602 can also be one or more special-purpose processing devices such as an application-specific integrated circuit (ASIC), a field programmable gate array (FPGA), a digital signal processor (DSP), a network processor, or the like. The processing device 602 is configured to execute instructions 616 for performing the operations and steps discussed herein. The computer system 600 can further include a network interface device 608 to communicate over a network 612.

The data storage device 610 can include a machine-readable storage medium 614 (also known as a computer-readable medium) on which is stored one or more sets of instructions 616 or software embodying any one or more of the methodologies or functions described herein. The instructions 616 can also reside, completely or at least partially, within the main memory 604 and/or within the processing device 602 during execution thereof by the computer system 600, the main memory 604 and the processing device 602 also constituting machine-readable storage media. The machine-readable storage medium 614, data storage device 610, and/or main memory 604 can correspond to the memory sub-system 110 of FIG. 1.

In one example, the instructions 616 include instructions to implement functionality corresponding to providing block failure protection for a zone memory sub-system as described herein (e.g., the REH component 113 of FIG. 1). While the machine-readable storage medium 614 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Described implementations of the subject matter can include one or more features, alone or in combination as illustrated below by way of examples.

Example 1: A system comprising: a memory device; and a processing device, operatively coupled to the memory device, configured to perform operations comprising: receiving a request to program data to an individual word line (WL) of the memory device; determining a set of attributes associated with the individual WL; computing a program voltage offset based on the set of attributes associated with the individual WL; and programming the data to the individual WL using a program pulse generated based on a base program voltage and the computed program voltage offset.

Example 2. The system of Example 1, wherein determining the set of attributes comprises: identifying a WL zone associated with the individual WL, the WL zone grouping together a plurality of WLs exhibiting similar programming voltage characteristics.

Example 3. The system of any one of Examples 1-2, wherein determining the set of attributes comprises: obtaining a program/erase count (PEC) of a block comprising the individual WL.

Example 4. The system of any one of Examples 1-3, wherein computing the program voltage offset comprises: applying a mathematical function that takes as inputs a program/erase count (PEC) associated with the individual WL and a WL zone identifier to generate the program voltage offset.

Example 5. The system of any one of Examples 1-4, wherein computing the program voltage offset comprises: retrieving the program voltage offset from a look-up table based on a program/erase count (PEC) associated with the individual WL and a WL zone identifier.

Example 6. The system of Example 5, the operations comprising: storing in the look-up table a plurality of WL zones each associated with a different set of PECs and program voltage offsets, a first entry in the look-up table associating a first zone representing a plurality of WLs and a first range of PECs with a first program voltage offset, a second entry in the look-up table associating the first zone representing the plurality of WLs and a second range of PECs with a second program voltage offset.

Example 7. The system of any one of Examples 1-6, wherein programming the data comprises: programming a first sub-block of the individual WL using the program pulse that starts at a voltage level equal to the base program voltage increased by the computed program voltage offset.

Example 8. The system of Example 7, the operations further comprising: receiving a sampled voltage offset from the memory device after programming the first sub-block; and programming remaining sub-blocks of the individual WL using a second program pulse based on the sampled voltage offset.

Example 9. The system of Example 8, the operations further comprising: applying an initial program pulse at the base program voltage plus the computed program voltage offset; incrementally increasing the program voltage plus the computed program voltage offset by a fixed voltage step for subsequent program pulses; monitoring memory cell states during application of the program pulses to detect when cells begin transitioning from an erase state to a programmed state; and storing, in a register of the memory device, the sampled voltage offset representing a difference between the initial program pulse and a program voltage at which the cells begin transitioning.

Example 10. The system of any one of Examples 1-9, the operations comprising: storing the computed program voltage offset; and setting an offset flag for a WL zone comprising a set of WLs including the individual WL.

Example 11. The system of Example 10, the operations comprising: receiving a request to program additional data to an additional WL of the memory device; determining the additional WL is in the WL zone having the offset flag set; in response to determining the additional WL is in the WL zone having the offset flag set; retrieving the computed program voltage offset; and programming the additional data to the additional WL using an additional program pulse generated based on the base program voltage and the retrieved program voltage offset.

Example 12. The system of any one of Examples 10-11, the operations comprising: clearing another offset flag that has been set for a previous zone comprising a different set of WLs.

Example 13. The system of any one of Examples 1-12, the operations comprising: setting a zone offset flag associated with a current WL zone comprising the individual WL after computing the program voltage offset; and maintaining the computed program voltage offset for programming subsequent WLs within the current WL zone while the zone offset flag remains set.

Example 14. The system of Example 13, the operations comprising: determining that a next WL to be programmed belongs to a different WL zone; clearing the zone offset flag associated with the current WL zone; and computing a new program voltage offset for the different WL zone.

Example 15. The system of any one of Examples 1-14, wherein a mathematical function used to compute the program voltage offset is generated by: performing program operations across multiple memory device samples during device characterization to collect programming voltage offset values for each WL at different program/erase counts (PECs) ranging from zero to an end-of-life value; analyzing the collected programming voltage offset values to identify WLs exhibiting similar voltage offset characteristics and grouping the identified WLs into WL zones; and deriving coefficients for the mathematical function by establishing a relationship between PECs and programming voltage offset for each WL zone, wherein the coefficients are selected to ensure the computed program voltage offset remains below actual required programming voltages while enabling skipping of unnecessary initial program pulses.

Example 16. The system of any one of Examples 1-15, wherein the processing device comprises a local media controller that receives instructions from a memory controller of a memory sub-system.

Example 17. The system of any one of Examples 1-16, wherein the memory device comprises a three-dimensional (3D) NAND device.

Example 18. At least one non-transitory machine-readable storage medium comprising instructions that, when executed by a processing device, cause the processing device to perform operations comprising: receiving a request to program data to an individual word line (WL) of a memory device; determining a set of attributes associated with the individual WL; computing a program voltage offset based on the set of attributes associated with the individual WL; and programming the data to the individual WL using a program pulse generated based on a base program voltage and the computed program voltage offset.

Example 19. A method comprising: receiving a request to program data to an individual word line (WL) of a memory device; determining a set of attributes associated with the individual WL; computing a program voltage offset based on the set of attributes associated with the individual WL; and programming the data to the individual WL using a program pulse generated based on a base program voltage and the computed program voltage offset.

Example 20. The method of Example 19, wherein determining the set of attributes comprises: identifying a WL zone associated with the individual WL, the WL zone grouping together a plurality of WLs exhibiting similar programming voltage characteristics.

The term "coupled with" generally refers to a connection between components, which can be an indirect communicative connection or direct communicative connection (e.g., without intervening components), whether wired or wireless, including connections such as electrical, optical, magnetic, and the like.

"System data" hereinafter refers to data that is created and/or maintained by the memory sub-system for performing operations in response to host requests and for media management.

"User data" hereinafter generally refers to host data and garbage collection data.

"Read disturb" refers to a phenomenon where repeated read operations on a specific WL in a NAND flash memory block cause unintended changes in the threshold voltages of adjacent cells on unselected WLs within the same block. This effect can potentially lead to data corruption in neighboring cells if left unmanaged, necessitating periodic data refresh or block relocation (folding) operations to maintain data integrity in NAND-based storage devices.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium (such as a non-transitory machine-readable medium) having stored thereon instructions, which can be used to program a computer system (or other electronic devices) to perform a process according to the present disclosure. A machine-readable medium includes any mechanism for storing information in a form readable by a machine (e.g., a computer). In some examples, a machine-readable (e.g., computer-readable) medium includes a machine (e.g., a computer) readable storage medium such as a ROM, RAM, magnetic disk storage media, optical storage media, flash memory components, and so forth. A machine-readable storage medium can be non-transitory (in other words, not having any transitory signals) in that it does not embody a propagating signal. However, labeling a machine-readable storage medium "non-transitory" should not be construed to mean that the machine-readable storage medium is incapable of movement; the machine-readable storage medium should be considered as being transportable from one physical location to another.

In the foregoing specification, examples of the disclosure have been described with reference to specific examples thereof. It will be evident that various modifications can be made thereto without departing from the broader scope of examples of the disclosure as set forth in the following claims. The specification and drawings are, accordingly, to be regarded in an illustrative sense rather than a restrictive sense.

The invention claimed is:

1. A system comprising:

a memory device; and a processing device, operatively coupled to the memory device, programmed to cause the system to perform operations comprising:

receiving a request to program data to an individual word line (WL) of the memory device;

determining a set of attributes associated with the individual WL;

computing a program voltage offset based on the set of attributes associated with the individual WL;

setting a zone offset flag associated with a current WL zone comprising the individual WL after computing the program voltage offset;

maintaining the computed program voltage offset for programming subsequent WLs within the current WL zone while the zone offset flag remains set; and programming the data to the individual WL using a program pulse generated based on a base program voltage and the computed program voltage offset.

2. The system of claim 1, wherein determining the set of attributes comprises:

identifying a WL zone associated with the individual WL, the WL zone grouping together a plurality of WLs exhibiting similar programming voltage characteristics.

3. The system of claim 1, wherein determining the set of attributes comprises:

obtaining a program/erase count (PEC) of a block comprising the individual WL.

4. The system of claim 1, wherein computing the program voltage offset comprises:

applying a mathematical function that takes as inputs a program/erase count (PEC) associated with the individual WL and a WL zone identifier to generate the program voltage offset.

5. The system of claim 1, wherein computing the program voltage offset comprises:

retrieving the program voltage offset from a look-up table based on a program/erase count (PEC) associated with the individual WL and a WL zone identifier.

6. The system of claim 5, the operations comprising:

storing in the look-up table a plurality of WL zones each associated with a different set of PECs and program voltage offsets, a first entry in the look-up table associating a first zone representing a plurality of WLs and a first range of PECs with a first program voltage offset, a second entry in the look-up table associating the first zone representing the plurality of WLs and a second range of PECs with a second program voltage offset.

7. The system of claim 1, wherein programming the data comprises:

programming a first sub-block of the individual WL using the program pulse that starts at a voltage level equal to the base program voltage increased by the computed program voltage offset.

8. The system of claim 7, the operations further comprising:

receiving a sampled voltage offset from the memory device after programming the first sub-block; and programming remaining sub-blocks of the individual WL using a second program pulse based on the sampled voltage offset.

9. The system of claim 8, the operations further comprising:

applying an initial program pulse at the base program voltage plus the computed program voltage offset;

incrementally increasing the program voltage plus the computed program voltage offset by a fixed voltage step for subsequent program pulses;

monitoring memory cell states during application of the program pulses to detect when cells begin transitioning from an erase state to a programmed state; and storing, in a register of the memory device, the sampled voltage offset representing a difference between the initial program pulse and a program voltage at which the cells begin transitioning.

10. The system of claim 1, the operations comprising:

storing the computed program voltage offset; and setting an offset flag for a WL zone comprising a set of WLs including the individual WL.

11. The system of claim 10, the operations comprising:

receiving a request to program additional data to an additional WL of the memory device;

determining the additional WL is in the WL zone having the offset flag set;

in response to determining the additional WL is in the WL zone having the offset flag set;

retrieving the computed program voltage offset; and programming the additional data to the additional WL using an additional program pulse generated based on the base program voltage and the retrieved program voltage offset.

12. The system of claim 10, the operations comprising:

clearing another offset flag that has been set for a previous zone comprising a different set of WLs.

13. The system of claim 1, the operations comprising:

determining that a next WL to be programmed belongs to a different WL zone;

clearing the zone offset flag associated with the current WL zone; and computing a new program voltage offset for the different WL zone.

14. The system of claim 1, wherein a mathematical function used to compute the program voltage offset is generated by:

performing program operations across multiple memory device samples during device characterization to collect programming voltage offset values for each WL at different program/erase counts (PECs) ranging from zero to an end-of-life value;

analyzing the collected programming voltage offset values to identify WLs exhibiting similar voltage offset characteristics and grouping the identified WLs into WL zones; and deriving coefficients for the mathematical function by establishing a relationship between PECs and programming voltage offset for each WL zone, wherein the coefficients are selected to ensure the computed program voltage offset remains below actual required programming voltages while enabling skipping of unnecessary initial program pulses.

15. The system of claim 1, wherein the processing device comprises a local media controller that receives instructions from a memory controller of a memory sub-system.

16. The system of claim 1, wherein the memory device comprises a three- dimensional (3D) NAND device.

17. At least one non-transitory machine-readable storage medium comprising instructions that, when executed by a processing device, cause the processing device to perform operations comprising:

receiving a request to program data to an individual word line (WL) of a memory device;

determining a set of attributes associated with the individual WL;

computing a program voltage offset based on the set of attributes associated with the individual WL;

setting a zone offset flag associated with a current WL zone comprising the individual WL after computing the program voltage offset;

maintaining the computed program voltage offset for programming subsequent WLs within the current WL zone while the zone offset flag remains set; and programming the data to the individual WL using a program pulse generated based on a base program voltage and the computed program voltage offset.

18. A method comprising:

receiving a request to program data to an individual word line (WL) of a memory device;

determining a set of attributes associated with the individual WL;

computing a program voltage offset based on the set of attributes associated with the individual WL;

setting a zone offset flag associated with a current WL zone comprising the individual WL after computing the program voltage offset;

maintaining the computed program voltage offset for programming subsequent WLs within the current WL zone while the zone offset flag remains set; and programming the data to the individual WL using a program pulse generated based on a base program voltage and the computed program voltage offset.

19. The method of claim 18, wherein determining the set of attributes comprises:

identifying a WL zone associated with the individual WL, the WL zone grouping together a plurality of WLs exhibiting similar programming voltage characteristics.

20. The method of claim 18, comprising:

determining that a next WL to be programmed belongs to a different WL zone;

clearing the zone offset flag associated with the current WL zone; and computing a new program voltage offset for the different WL zone.

* * * * *